United States Patent
Yang et al.

(10) Patent No.: US 8,560,997 B1
(45) Date of Patent: Oct. 15, 2013

(54) CONDITIONAL CELL PLACEMENT

(75) Inventors: Ping-Lin Yang, Changhua County (TW);
Ming-Zhang Kuo, Tainan County (TW);
Cheng-Chung Lin, Hsin-Chu (TW);
Jimmy Hsiao, Hsin-Chu (TW);
Jia-Rong Hsu, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/557,578

(22) Filed: Jul. 25, 2012

(51) Int. Cl.
*G06F 17/50* (2006.01)

(52) U.S. Cl.
USPC .......................................................... 716/122

(58) Field of Classification Search
USPC .......................................................... 716/122
See application file for complete search history.

(56) References Cited

U.S. PATENT DOCUMENTS

| | | | | |
|---|---|---|---|---|
| 2007/0271441 A1* | 11/2007 | Shaw et al. | ...................... | 712/41 |
| 2009/0083686 A1* | 3/2009 | Itaka et al. | ........................ | 716/8 |
| 2009/0249273 A1* | 10/2009 | Tsai et al. | ......................... | 716/8 |
| 2009/0271752 A1* | 10/2009 | Alpert et al. | ...................... | 716/9 |
| 2009/0321791 A1* | 12/2009 | Wagner | ......................... | 257/207 |

* cited by examiner

*Primary Examiner* — Jack Chiang
*Assistant Examiner* — Mohammed Alam
(74) *Attorney, Agent, or Firm* — Cooper Legal Group LLC

(57) ABSTRACT

Among other things, one or more techniques for conditional cell placement are provided herein. In an embodiment, a conditional boundary is created for a first cell. For example, the conditional boundary enables the first cell to be placed relative to a second cell based on a conditional placement rule. In an embodiment, the first cell is placed in a first manner relative to the second cell based in a first scenario. In a second scenario, different than the first scenario, the first cell is placed in a second manner relative to the second cell. In this manner, conditional cell placement is provided, thus providing flexibility and improved layout efficiency with regard to semiconductor fabrication, for example.

20 Claims, 13 Drawing Sheets

CONDITIONAL CELL PLACEMENT

BACKGROUND

Generally, cells of a semiconductor device are laid out according to a place-and-route boundary (prBoundary). For example, a first cell is abutted against a second cell along prBoundaries for the respective cells. However, a prBoundary is not flexible, and placement of cells is not efficient in some scenarios when cells are placed or abutted according to a prBoundary. For example, such cell placement is associated with a decrease in power, performance, and area (PPA). Moreover, prBoundary cell placement wastes space in some scenarios at least because the first cell is separated from the second cell by decap cells or filler cells.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Among other things, one or more techniques and systems for conditional cell placement in a semiconductor layout are provided herein. In an embodiment, a conditional boundary is created for a first cell. For example, the conditional boundary is created in addition to a place-and-route boundary (prBoundary). The conditional boundary is a boundary configured to enable flexible cell placement within a semiconductor layout environment. In an embodiment, the conditional boundary is a place-and-route boundary configured to facilitate positioning between cells based on a cell layout of a neighboring cell. In an embodiment, the first cell is placed relative to a second cell neighboring the first cell based at least in part on the conditional boundary of the first cell. For example, if a first cell comprises a first prBoundary and a first conditional boundary, and a second cell comprises a second prBoundary and a second conditional boundary, conditional cell placement is enabled according to at least one of the first conditional boundary or the second conditional boundary. In an embodiment, the conditional boundary of the first cell enables placement of the first cell relative to the second cell in a manner such that the first prBoundary overlaps the second prBoundary. Therefore, conditional cell placement is provided in an efficient manner at least because cell placement is not limited merely by the prBoundary as a constraint.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements or structures of the drawings are not necessarily be drawn to scale. Accordingly, the dimensions of the various features may be arbitrarily increased or reduced for clarity of discussion.

DETAILED DESCRIPTION

Figure 1:
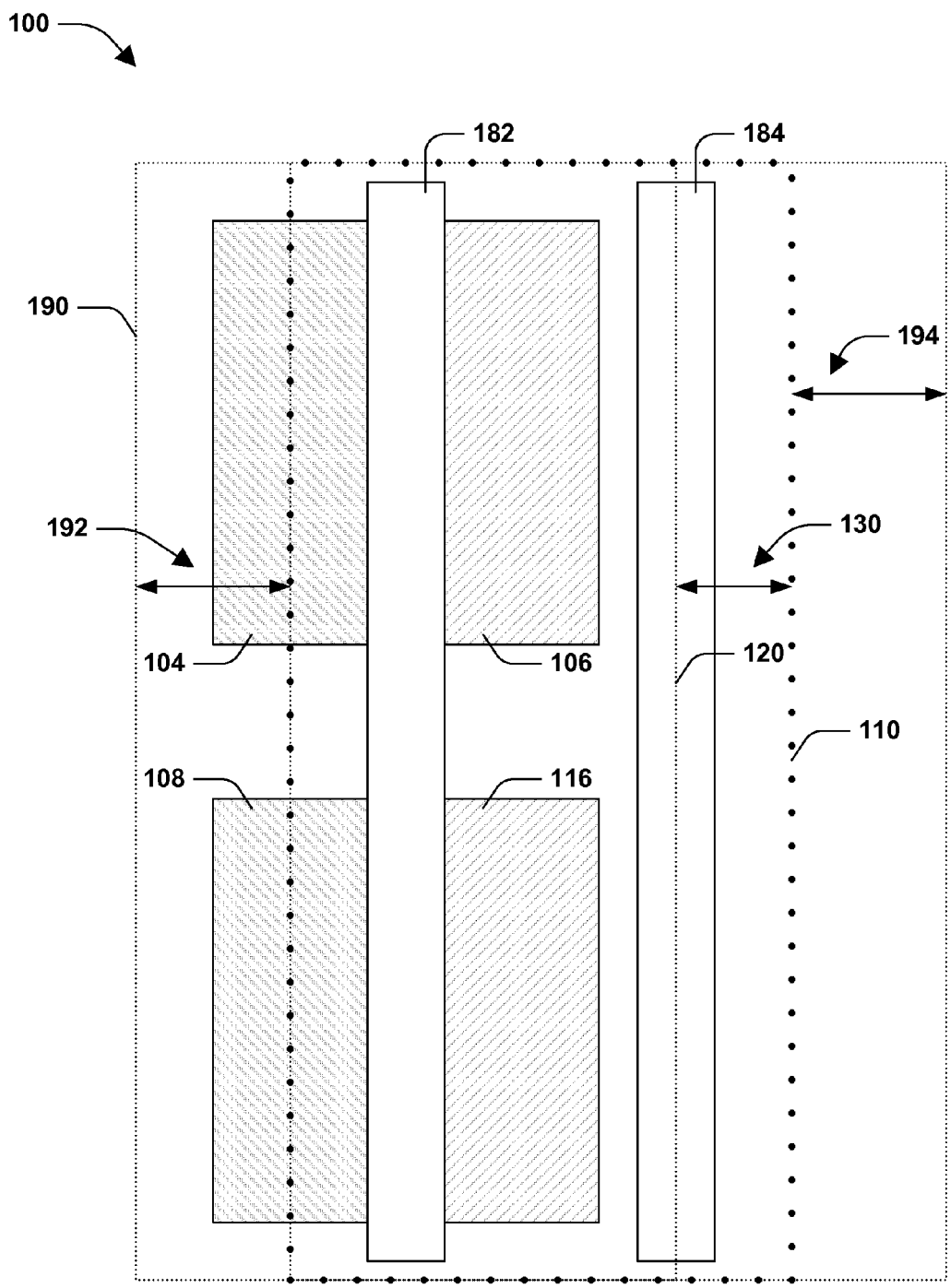
FIG. 1 is a top-down or layout view of an example cell, according to an embodiment.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Generally, cells of a semiconductor device, such as an AND cell, OR cell, NAND, cell, NOR cell, flip flop cell, XOR cell, INV cell, etc. are laid out in a semiconductor layout environment such that respective cells are abutted according to a place-and-route boundary (prBoundary). However, use of such a prBoundary does not provide for flexible cell placement, at least because cells are generally abutted against a prBoundary of another cell. For example, if a first cell is on a left side and a second cell is on a right side, a prBoundary placement configuration generally requires a prBoundary for the first cell to be abutted against a prBoundary for the second cell during cell placement.

It will be appreciated that in some scenarios, the first cell and the second cell are capable of being compacted such that the prBoundary of the first cell overlaps the prBoundary of the second cell, thus "breaking" a limitation of the respective prBoundaries. Accordingly, space on a semiconductor device is wasted if such an overlap is not provided in a layout associated with the first cell and the second cell. Additionally, power, performance, and area (PPA) are affected in a negative manner if cell placement is abutted merely based on the respective prBoundaries. In an embodiment, a method for conditional cell placement in a semiconductor layout is provided, comprising creating a conditional boundary for a first cell and placing the first cell relative to a second cell based at least in part on the conditional boundary of the first cell. For example, the conditional boundary of the first cell is abutted against a conditional boundary of the second cell such that a prBoundary of the first cell overlaps a prBoundary of the second cell.

In an embodiment, a conditional boundary for a first cell is created based at least in part on a relationship between a first cell and a second cell. In an embodiment, the first cell is placed relative to the second cell based at least in part on the conditional boundary and a conditional placement rule. For example, if a first cell is laid out in a first manner relative to the second cell in a first scenario and laid out in a second manner relative to the second cell in a second scenario, the first cell is placed relative to the second cell in a corresponding manner based on the conditional boundary and the conditional placement rule.

In an embodiment, a system for conditional cell placement is provided comprising a boundary component configured to create a first conditional boundary and a first place-and-route boundary (prBoundary) for a first cell. In an embodiment, the boundary component is configured to create a second conditional boundary and a second prBoundary for a second cell. Additionally, the conditional cell placement system comprises a placement engine configured to place the first cell relative to the second cell based at least in part on at least one of the first conditional boundary or the second conditional boundary and at least one of the first prBoundary or the second prBoundary. Therefore, the first cell is placed relative to the second cell according to at least one of the conditional boundaries and at least one of the prBoundaries. For example, in an embodiment, the first cell is placed relative to the second cell such that the first conditional boundary abuts the second conditional boundary. In another embodiment, the first cell is placed relative to the second cell by rotating an orientation of the first cell or flipping the first cell according to a line of symmetry.

FIG. 1 is a top-down or layout view 100 of an example cell, according to an embodiment. In an embodiment, a cell in a semiconductor layout environment comprises a PMOS source 104, a PMOS drain 106, an NMOS source 108, and an NMOS drain 116. Additionally, the cell comprises one or more gates 182 and 184. In an embodiment, 182 is a gate and 184 is a dummy gate. In an embodiment, the cell is placed relative to other cells based on a place-and-route boundary (prBoundary) 110. In an embodiment, the prBoundary 110 encompasses gates 182 and 184, a portion of the PMOS source 104, a portion of the NMOS source 108, the PMOS drain 106, and the NMOS drain 116. It will be appreciated that prBoundary 110 encompasses an empty space 130, and in some scenarios, the empty space 130 is wasted or abutted against additional empty space. Accordingly, conditional boundary 120 is configured to encompass at least a portion of gate 184, gate 182, at least a portion of the PMOS source 104, at least a portion of the NMOS source 108, the PMOS drain 106, and the NMOS drain 116. However, it will be appreciated that conditional boundary 120 does not encompass the empty space 130, and is therefore enables the cell to be abutted against another cell at conditional boundary 120 such that the prBoundary 110 overlaps the other cell. Therefore, a chip in the semiconductor layout environment comprising the cell of FIG. 1 is provided with a compacted chip area and an improved power, performance, and area (PPA) at least because the conditional boundary 120 allows for a tighter cell layout.

In other embodiments, it will be appreciated that a conditional boundary is used to provide additional separation between cells, rather than to a compact cell arrangement. For example, if a first cell comprises a first prBoundary and a second cell comprises a second prBoundary, a first conditional boundary for the first cell is larger than the first prBoundary and a second conditional boundary for the second is larger than the second prBoundary. For example, in another embodiment, 190 of FIG. 1 is the conditional boundary, rather than 120. Accordingly, if the cell is abutted to another cell at the conditional boundary 190, additional separation is provided by spaces 192 and 194.

Figure 2:
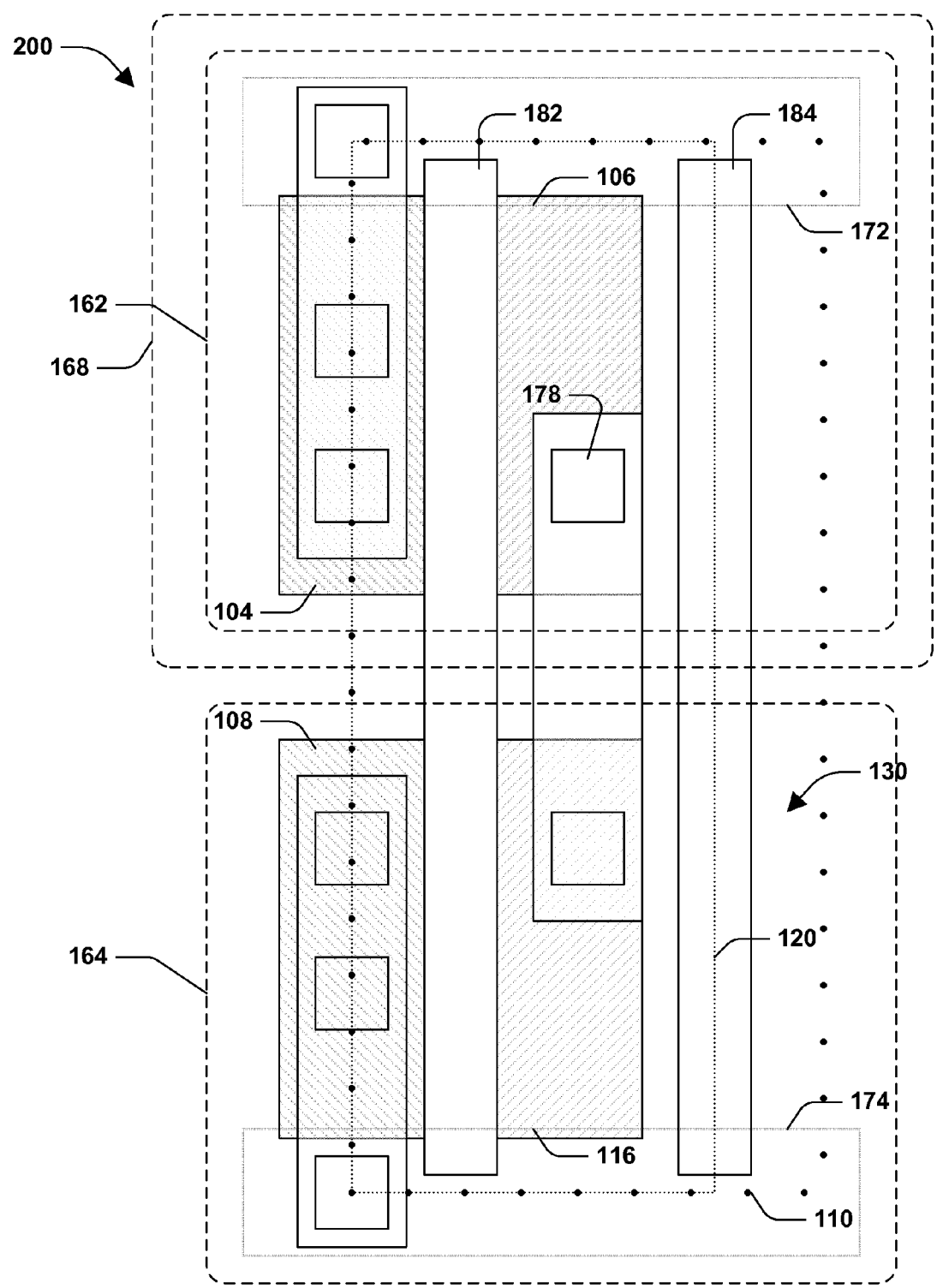
FIG. 2 is a top-down or layout view of an example cell, according to an embodiment.

FIG. 2 is a top-down or layout view 200 of an example cell, according to an embodiment. For example, the layout view 200 is in a semiconductor layout environment for laying out a semiconductor chip comprising the example cell. In an embodiment, the cell comprises gates 182 and 184, an N-well 168, a P implant region associated with a PMOS region 162, an N implant region associated with an NMOS region 164, and the cell is an inverter. In an embodiment, the PMOS region comprises a PMOS source 104 and a PMOS drain 106. Additionally, the NMOS region comprises an NMOS source 108 and an NMOS drain 116. In an embodiment, the PMOS source 104 is connected to Vdd 172 and the NMOS source 108 is connected to Vss 174. In an embodiment, via 178 connects the PMOS drain 106 to an output of the inverter. For example, via 178 connects the PMOS drain 106 to the NMOS drain 116 via a connection layer. In an embodiment, a prBoundary 110 is configured to encompass gates 182 and 184, at least a portion of the PMOS source 104, at least a portion of the NMOS source 108, the PMOS drain 106, the NMOS drain 116, via 178, at least a portion of Vdd 172, and at least a portion of Vss 174. However, it will be appreciated that the prBoundary 110 is configured to encompass empty space 130, and in some scenarios, the cell of FIG. 2 is capable of being compacted against another cell such that the empty space 130 is mitigated, for example. Accordingly, a conditional boundary 120 is configured to encompass at least a portion of gate 184, gate 182, at least a portion of the PMOS source 104, at least a portion of the NMOS source 108, the PMOS drain 106, the NMOS drain 116, via 178, at least a portion of Vdd 172, and at least a portion of Vss 174. Therefore, the conditional boundary 120 does not encompass empty space 130, and enables the cell of FIG. 2 to be abutted against another cell such that the empty space 130 is mitigated and the prBoundary 110 overlaps the other cell. In an embodiment, the conditional boundary 120 is created based at least in part on a relationship between the cell of FIG. 2 and another cell.

For at least some of the Figs., it will be appreciated that the first prBoundary 112, the second prBoundary 114, the first conditional boundary 122, and the second conditional boundary 124 comprise a same height such that a top of the first prBoundary 112, the second prBoundary 114, the first conditional boundary 122, and the second conditional boundary 124 are at line 180. In other words, the first prBoundary 112, the second prBoundary 114, the first conditional boundary 122, and the second conditional boundary 124 are drawn with different heights merely for illustrative purposes, and are not necessarily drawn to scale. That is, because dashed and dotted lines are used to represent different boundaries, if the dashed and dotted lines were drawn on top of one another they would not be distinguishable in the Figs. Accordingly, dimensions of some of these boundaries are drawn to be taller or shorter than needed so that the different boundaries are visible in the Figs., for example.

Figure 3:
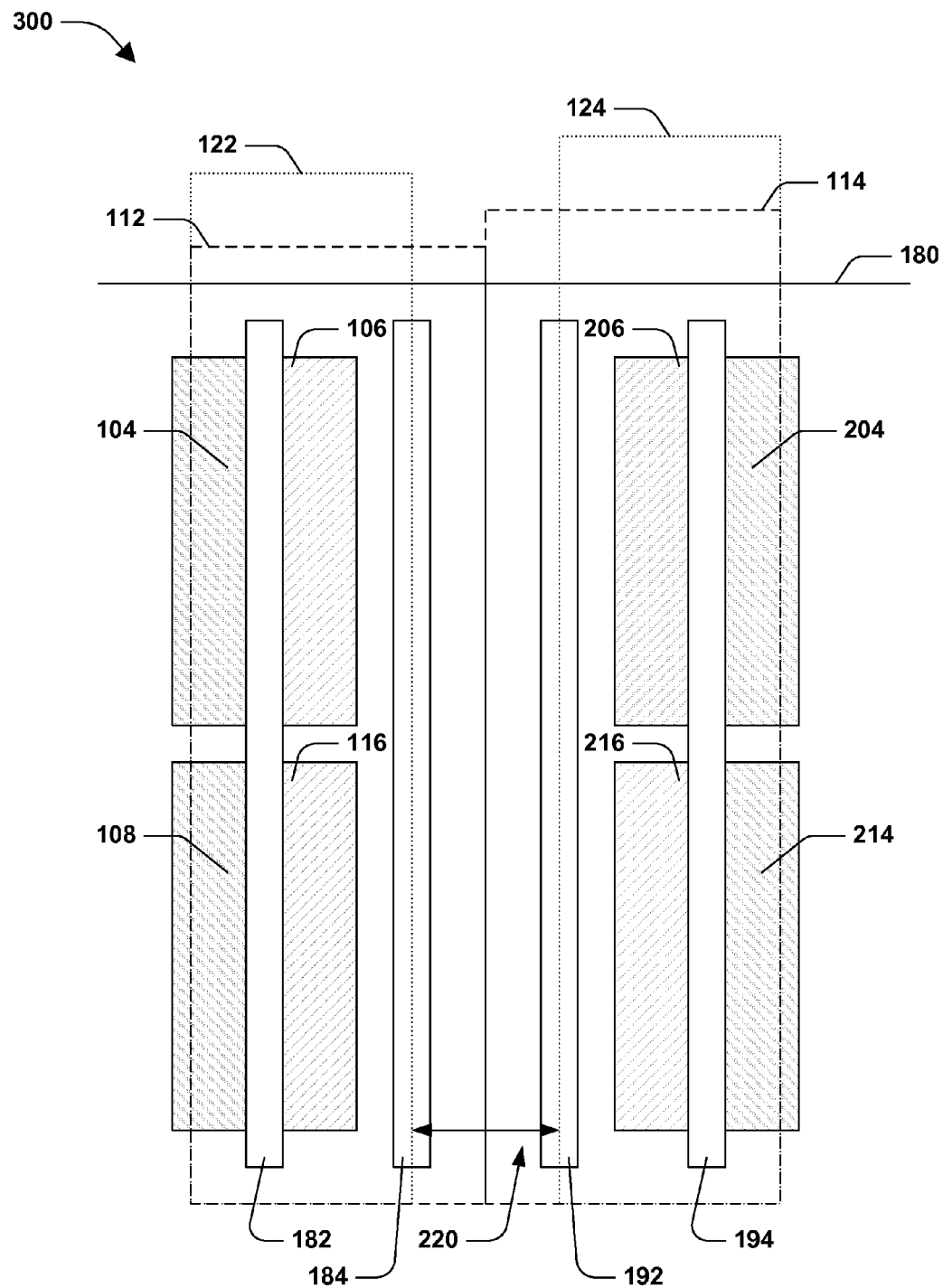
FIG. 3 is a top-down or layout view of an example conditional cell placement layout, according to an embodiment.

FIG. 3 is a top-down or layout view 300 of an example conditional cell placement layout, according to an embodiment. In an embodiment, the first cell comprises a PMOS source 104, a PMOS drain 106, an NMOS source 108, an NMOS drain 116, and gates 182 and 184. For example, according to a first prBoundary 112 of the first cell, the first cell comprises two gates 182 and 184. Similarly, the second cell comprises a PMOS source 204, a PMOS drain 206, an NMOS source 214, an NMOS drain 216, and gates 192 and 194. For example, according to a second prBoundary 114 of the second cell, the second cell comprises two gates 192 and 194. In an embodiment, the first cell is placed relative to the second cell based on the first prBoundary 112 and the second prBoundary 114. In this example, the first prBoundary 112 is abutted against the second prBoundary 114, thus abutting the first cell against the second cell.

In an embodiment according to FIG. 3, a first cell on the left is abutted against a second cell on the right based on prBoundaries 112 and 114 for the cells. In this example, the first cell on the left is abutted against the second cell on the right such that respective drain sides 106, 206, 116, and 216 are closer than the respective source sides 104, 204, 114, and 214. In other embodiments, the first cell on the left is abutted against the second cell on the right such that respective source sides 104, 204, 114, and 214 are closer than the respective drain sides 106, 206, 116, and 216.

It will be appreciated that space 220 comprises a gap where no source and no drain exists. Therefore, if the space 220 between the first cell and the second cell is "removed" in the layout, the first cell and the second cell are operationally unaffected. In an embodiment, a first conditional boundary 122 encompasses gate 182, at least a portion of gate 184, at least a portion of PMOS source 104, a PMOS drain 106, at least a portion of NMOS source 108, and NMOS drain 116. In an embodiment, a second conditional boundary 124 encompasses gate 194, at least a portion of gate 192, at least a portion of PMOS source 204, a PMOS drain 206, at least a portion of NMOS source 214, and NMOS drain 216. First conditional boundary 122 for the first cell and second conditional boundary 124 for the second cell are created based at least in part on such a relationship between the first cell and the second cell. For example, since removal of space 220 does not affect logical operation of the first cell or the second cell, the first conditional boundary 122 and the second conditional boundary 124 are created according to space 220. In an embodiment, the first conditional boundary 122 and the second conditional boundary 124 are created based at least in part on at least one of removal of space 220, an effect of the removal of space 220 on the first cell or the second cell, or a relationship between the first cell and the second cell. In an example, the relationship between the first cell and the second cell is associated with removing an amount of space, such as space 220, such that operation of the first cell, operation of the second cell, and interaction between the first cell and the second cell are logically unaffected.

Figure 4:
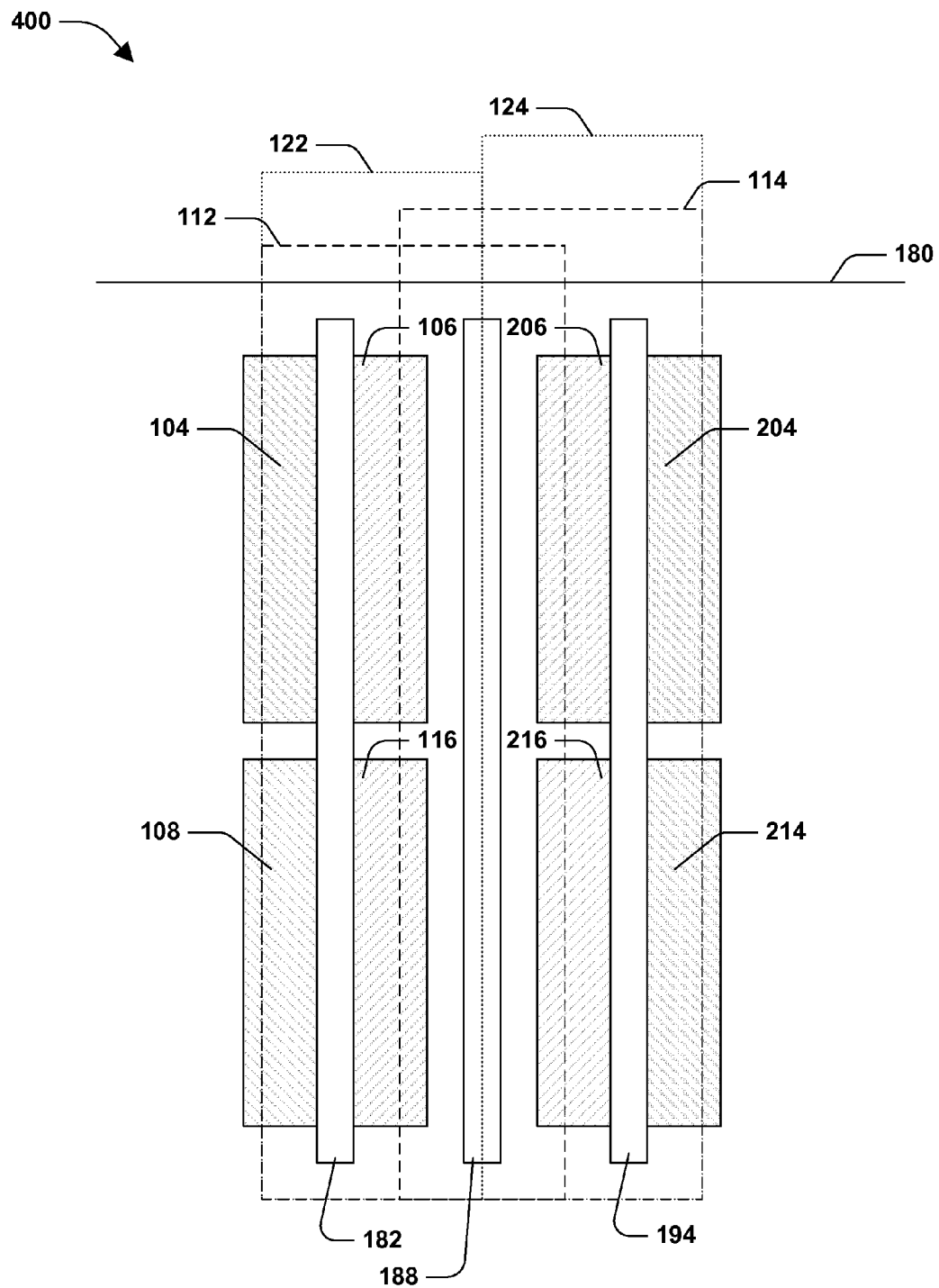
FIG. 4 is a top-down or layout view of an example conditional cell placement layout, according to an embodiment.

FIG. 4 is a top-down or layout view 400 of an example conditional cell placement layout, according to an embodiment. In an embodiment, the first cell on the left is abutted against the second cell on the right such that respective drain sides 106, 206, 116, and 216 are closer than the respective source sides 104, 204, 114, and 214. Similar to FIG. 3, the first cell comprises a PMOS source 104, a PMOS drain 106, an NMOS source 108, an NMOS drain 116, and gates 182 and 188. Additionally, the second cell comprises a PMOS source 204, a PMOS drain 206, an NMOS source 214, an NMOS drain 216, and gates 194 and 188. It will be appreciated that gate 188 is shared between the first cell and the second cell. In an embodiment, the first cell is placed relative to the second cell based on a first conditional boundary 122 and a second conditional boundary 124. In this example, the first conditional boundary 122 is abutted against the second conditional boundary 124. For example, the first conditional boundary 122 defines the first cell, and the second conditional boundary 124 defines the second cell, thus abutting the first cell against the second cell along respective conditional boundaries. Therefore, FIG. 4 is similar to FIG. 3, except that the first cell is abutted against the second cell based on the first conditional boundary 122 and the second conditional boundary 124, rather than the first prBoundary 112 and the second prBoundary 114. In an embodiment, the first prBoundary 112 of the first cell overlaps the second prBoundary 114 of the second cell.

It will be appreciated that space 220 of FIG. 3 is removed at least because the first cell is abutted against the second cell based on the first conditional boundary 122 and the second conditional boundary 124. Additionally, the first cell and the second cell of FIG. 4 are operationally unaffected by the removal of space 220 from FIG. 3, in comparison to the first cell and the second cell of FIG. 3. In an embodiment, a unit tile comprises a unit tile width and a unit tile height. For example, a cell width generally follows a multiple of the unit tile width. Similarly, a cell height generally follows a multiple of the unit tile height. In an embodiment, if space 220 is a multiple of at least one of the unit tile width or unit tile height, the first cell is abutted against the second cell by abutting the first conditional boundary 122 against the second conditional boundary 124. In this way the space 220 is removed, thus saving space 220 from being used within the semiconductor layout environment, and being filled with decap cells or filler cells, for example.

In an embodiment, the first cell is placed relative to the second cell based at least in part on a conditional placement rule. For example, the conditional placement rule enables the first cell to be placed relative to the second cell based on the first conditional boundary 122 and the second conditional boundary 124 in a first scenario and places the first cell relative to the second cell based on the first prBoundary 112 and the second prBoundary 114 in a second scenario. For example, in the first scenario, if the first cell is abutted against the second cell based on the first conditional boundary 122 and the second conditional boundary 124, functionality of the first cell and functionality of the second cell are not affected. That is, the first cell and the second cell operate as intended when abutted in a compacted manner associated with removal of space 220, such as in FIG. 3. However, in the second scenario, if the first cell is abutted against the second cell based on the first conditional boundary 122 and the second conditional boundary 124, functionality of the first cell and functionality of the second cell are affected in a negative manner. That is, the first cell and the second cell do not operate as intended when abutted in a compacted manner associated with removal of space 220, such as in FIG. 3. Therefore, the first cell is placed relative to the second cell based on the first prBoundary 112 and the second prBoundary 114 in a second scenario, rather than the first conditional boundary 122 and the second conditional boundary 124. In an embodiment, the conditional placement rule checks for appropriate functionality to determine a conditional boundary, for example. The conditional placement rule is based on a relationship between the first cell and the second cell in some embodiments. For example, the conditional placement rule enables abutting of cells based on conditional boundaries if a first cell interacts with a second cell in a same manner as when the cells are abutted based on prBoundaries. In other words, in an embodiment, a conditional placement rule checks for the first cell and the second cell of FIG. 4 to comprise a same functionality as the first cell and the second cell of FIG. 3, for example. In an embodiment, the first cell is placed relative to the second cell by abutting the first cell against the second cell based on at least one of a unit tile width or a unit tile height, a distance from the first conditional boundary 122 to the second conditional boundary 124, and no cells between the first conditional boundary 122 and the second conditional boundary 124. In an embodiment, the first cell is abutted against the second cell if the distance from the first conditional boundary 122 to the second conditional boundary 124, such as space 220 of FIG. 3, is a multiple of the unit tile width. In another embodiment, the first cell is abutted against the second cell based on no source regions and no drain regions between the first conditional boundary 122 and the second conditional boundary 124. In an embodiment, the first cell is placed relative to the second cell based on a design rule check (DRC).

It will be appreciated that in some embodiments, a computer aided design (CAD) layer is created for at least one of the first prBoundary 112, second prBoundary 114, first conditional boundary 122, or second conditional boundary 124. For example, one or more coordinates are associated with at least one of the first prBoundary 112, second prBoundary 114, first conditional boundary 122, or second conditional boundary 124. Additionally, the first conditional boundary 122 and the second conditional boundary 124 are associated with one or more offsets from the first prBoundary 112 and the second prBoundary 114, respectively. In this way, the first conditional boundary 122 and the second conditional boundary 124 are referenced by using offsets and the first prBoundary 112 and the second prBoundary 114.

Figure 5:
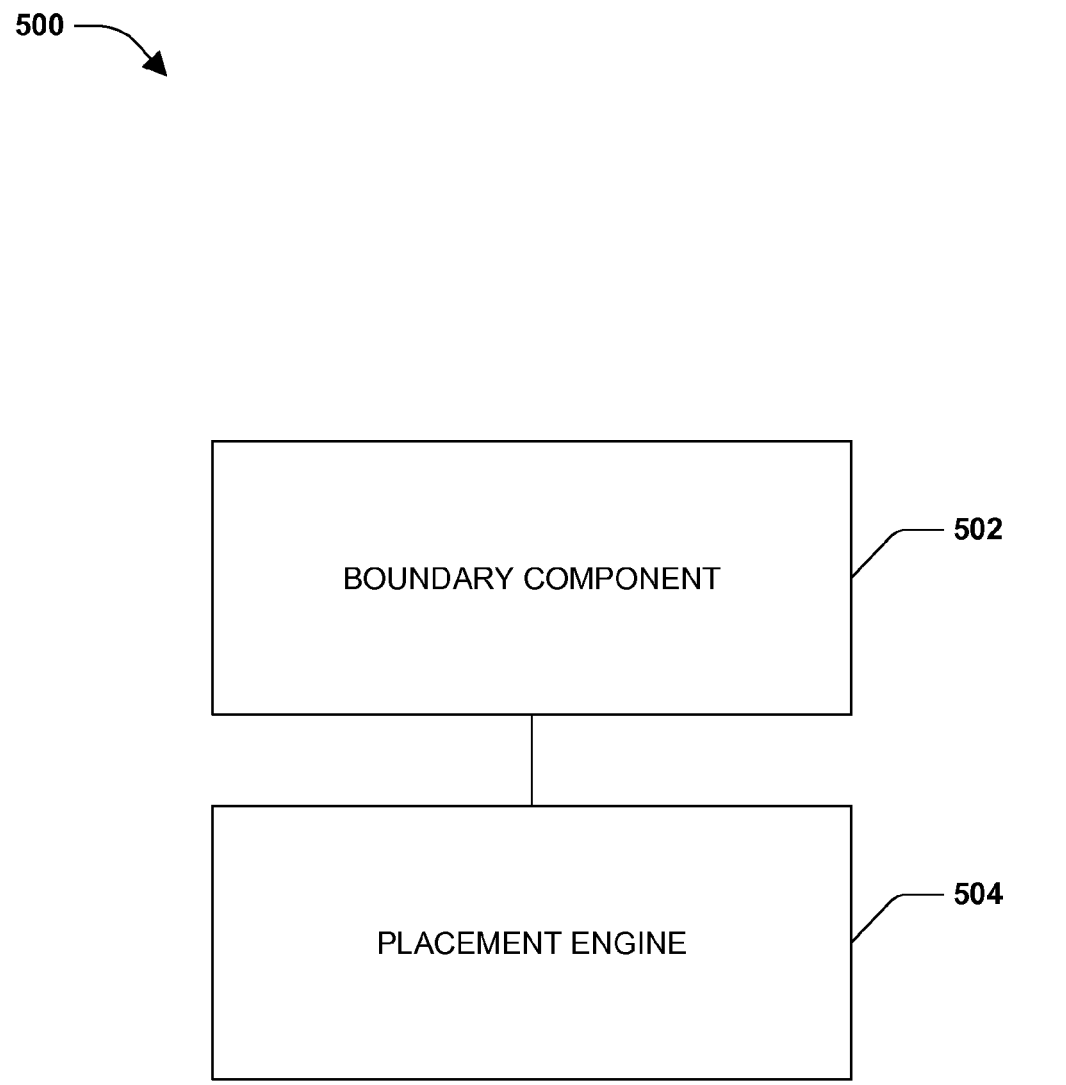
FIG. 5 is a component diagram of an example system for conditional cell placement, according to an embodiment.

FIG. 5 is a component diagram of an example system 500 for conditional cell placement, according to an embodiment. In an embodiment, the system 500 comprises a boundary component 502 and a placement engine 504. In an embodiment, the boundary component 502 is configured to create a first conditional boundary 122 and a first place-and-route boundary (prBoundary) 112 for a first cell. In an embodiment, the boundary component 502 is configured to create a second conditional boundary 124 and a second prBoundary 114 for a second cell. In an embodiment, the placement engine 504 is configured to place the first cell relative to the second cell based at least in part on at least one of the first conditional boundary 122 or the second conditional boundary 124 and at least one of the first prBoundary 112 or the second prBoundary 114. In an embodiment, the boundary component 502 is configured to create the conditional boundary for the first cell based at least in part on a relationship between the first cell and the second cell. In an embodiment, the placement engine 504 is configured to place the first cell relative to the second cell based at least in part on a conditional placement rule. In an embodiment, the placement engine 504 is configured to abut the first cell to the second cell based at least in part on a unit tile width, a unit tile height, a distance 220 from the conditional boundary 122 of the first cell to a second conditional boundary 124 of the second cell, and no cells between the conditional boundary 122 and the second conditional boundary 124.

Figure 6:
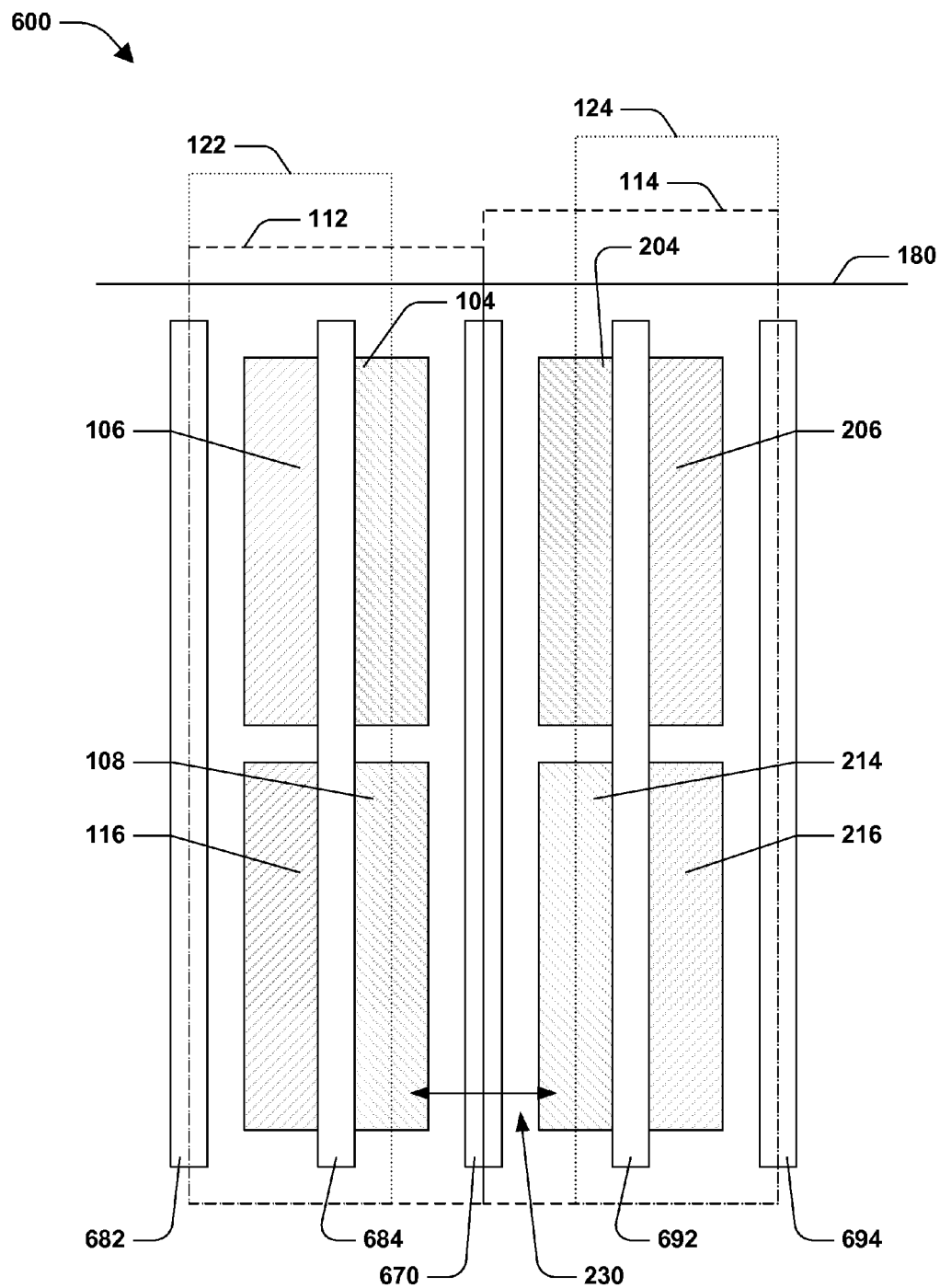
FIG. 6 is a top-down or layout view of an example conditional cell placement layout, according to an embodiment.

FIG. 6 is a top-down or layout view 600 of an example conditional cell placement layout, according to an embodiment. In an embodiment, a first prBoundary 112 defines a first cell, and comprises at least a portion of gate 682, at least a portion of gate 670, gate 684, a PMOS source 104, a PMOS drain 106, a NMOS source 108, and a NMOS drain 116. In an embodiment, a second prBoundary 114 defines a second cell, and comprises at least a portion of gate 694, at least a portion of gate 670, gate 692, a PMOS source 204, a PMOS drain 206, a NMOS source 214, and a NMOS drain 216.

It will be appreciated that in some scenarios, PMOS source 104 and NMOS source 108 of the first cell are capable of being abutted to PMOS source 204 and NMOS source 214 of the second cell. In an embodiment, the PMOS source 104 of the first cell is abutted to the PMOS source 204 of the second cell and the NMOS source 108 of the first cell is abutted to the NMOS source 214 of the second cell. In an embodiment, the first cell is capable of being abutted to the second cell based on a conditional placement rule. In an example, a conditional placement rule checks for at least one of the PMOS source 104 or the PMOS source 204 to be connected to a first power domain or a supply voltage (Vdd) 172 and at least one of the NMOS source 108 or the NMOS source 214 to be connected to a second power domain or a ground (VSS) 174 and abuts the first cell against the second cell accordingly.

In an embodiment according to FIG. 6, the first cell is placed relative to the second cell based on the first prBoundary 112 and the second prBoundary 114. In an embodiment, a first cell on the left is abutted against a second cell on the right based on prBoundaries 112 and 114 for the cells. In this example, the first cell on the left is abutted against the second cell on the right such that respective source sides 104, 204, 114, and 214 are closer than the respective drain sides 106, 206, 116, and 216.

It will be appreciated that space 230 comprises a gap where an additional gate 670 separates source regions 104 and 204 and 114 and 214 for the first cell and the second cell, respectively. In an embodiment, if the space 230 between the first cell and the second cell is "removed" in the layout 600, the first cell and the second cell are operationally unaffected. First conditional boundary 122 for the first cell and second conditional boundary 124 for the second cell are created or defined based at least in part on this relationship between the first cell and the second cell. For example, since removal of space 230 does not affect logical operation of the first cell or the second cell, the first conditional boundary 122 and the second conditional boundary 124 are created according to space 230. In an embodiment, the first conditional boundary 122 and the second conditional boundary 124 are created based at least in part on removal of space 230, an effect of the removal of space 230 on the first cell or the second cell, or a relationship between the first cell and the second cell. In an example, the relationship between the first cell and the second cell is associated with removing an amount of space, such as space 230, such that operation of the first cell, operation of the second cell, and interaction between the first cell and the second cell are logically unaffected.

Figure 7:
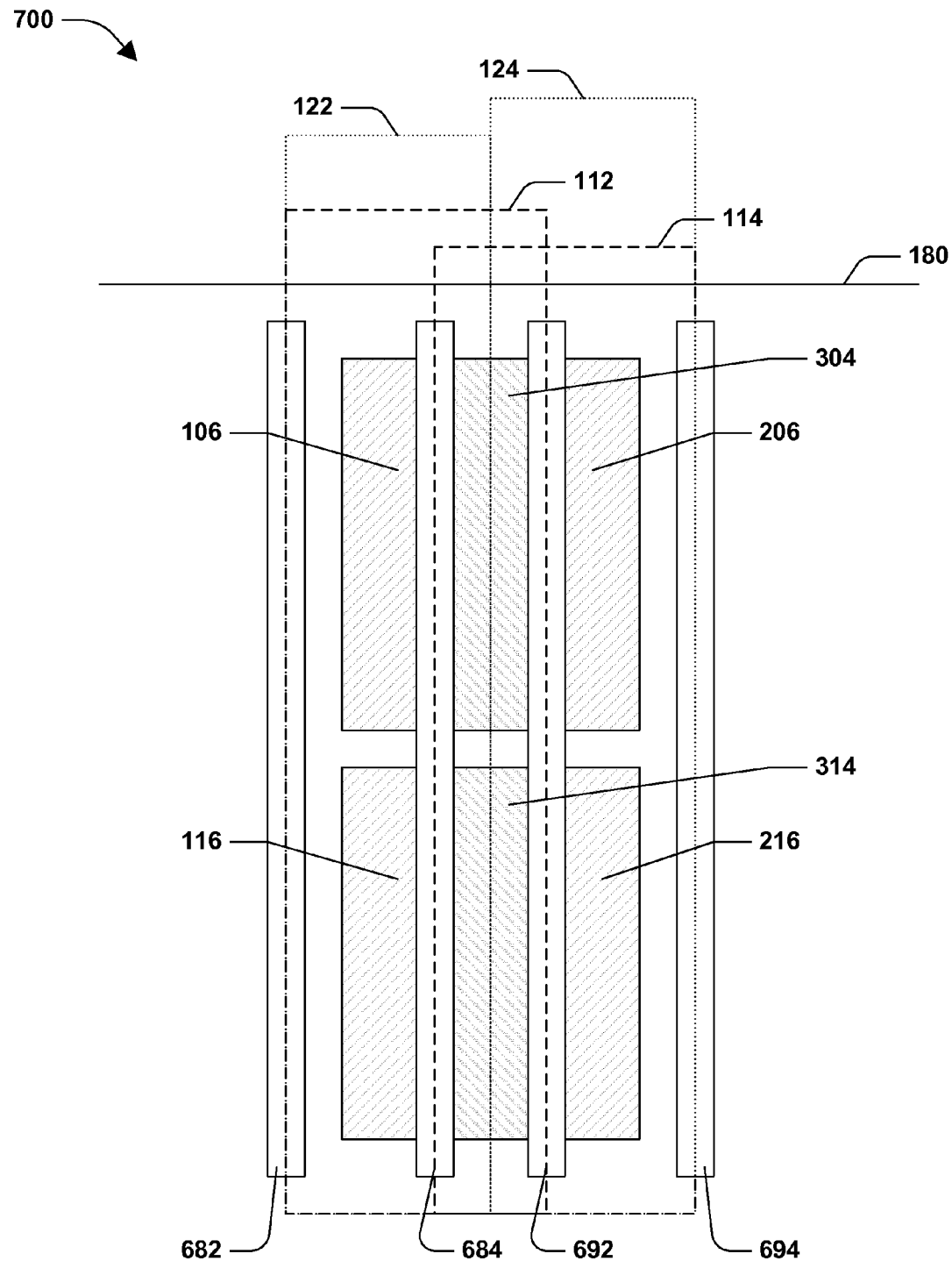
FIG. 7 is a top-down or layout view of an example conditional cell placement layout, according to an embodiment.

FIG. 7 is a top-down or layout view 700 of an example conditional cell placement layout, according to an embodiment. In an embodiment, the first cell on the left is abutted against the second cell on the right such that a shared PMOS source 304 and a shared NMOS source 314 are formed. In an embodiment, a first cell is abutted against a second cell based on a first conditional boundary 122 of the first cell and a second conditional boundary 124 of the second cell. In an embodiment, the first conditional boundary 122 encompasses at least a portion of gate 682, gate 684, a PMOS drain 106, an NMOS drain 116, at least a portion of a shared PMOS source 304, and at least a portion of a shared NMOS source 314. In an embodiment, the second conditional boundary 124 encompasses at least a portion of gate 694, gate 692 a PMOS drain 206, an NMOS drain 216, at least a portion of a shared PMOS source 304, and at least a portion of a shared NMOS source 314. In this example, the first conditional boundary 122 of the first cell is abutted against the second conditional boundary 124 of the second cell. For example, the first conditional boundary 122 defines the first cell, and the second conditional boundary 124 defines the second cell, thus abutting the first cell against the second cell along respective conditional boundaries. Therefore, FIG. 7 is similar to FIG. 6, except that the first cell is abutted against the second cell based on the first conditional boundary 122 and the second conditional boundary 124 in such a manner that the PMOS source 104 overlaps with the PMOS source 204 to form shared PMOS source 304. Similarly, the NMOS source 108 overlaps with the NMOS source 214 to form shared NMOS source 314. Additionally, space 230 is removed in FIG. 7 at least due to an overlap in a first prBoundary 112 and a second prBoundary 114.

It will be appreciated that space 230 of FIG. 6 is removed at least because the first cell is abutted against the second cell based on the first conditional boundary 122 and the second conditional boundary 124. Additionally, the first cell and the second cell of FIG. 7 are operationally unaffected by the removal of space 220 from FIG. 6, in comparison to the first cell and the second cell of FIG. 6. In this way the space 230 is removed, thus mitigating use of an additional unit tile width within the semiconductor layout environment. In an embodiment, a conditional placement rule checks for the first cell and the second cell of FIG. 7 to comprise a same functionality as the first cell and the second cell of FIG. 6, for example. Therefore, the conditional placement rule enables conditional cell placement based at least in part on a relationship between the first cell and the second cell. In an embodiment, a first cell is a neighboring cell relative to a second cell. For example, in an embodiment, a first cell is adjacent to a second cell if no cells are located between a first conditional boundary 122 of the first cell and a second conditional boundary 124 of the second cell.

Figure 8:
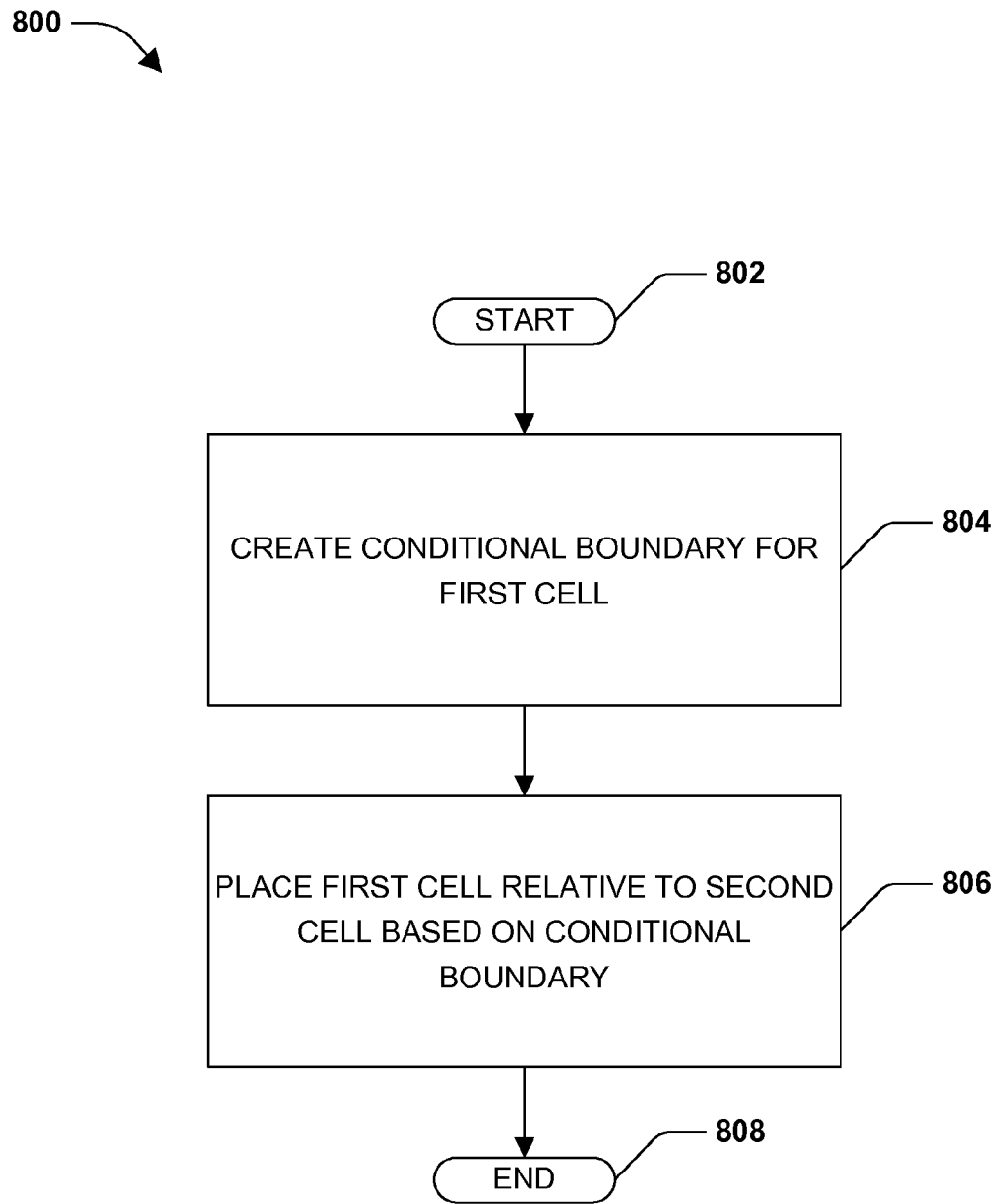
FIG. 8 is a flow diagram of an example method for conditional cell placement, according to an embodiment.

FIG. 8 is a flow diagram of an example method 800 for conditional cell placement, according to an embodiment. At 802, the method 800 begins, at 804, a conditional boundary 122 is created for a first cell. At 806, the first cell is placed relative to a second cell based at least in part on the conditional boundary 122 of the first cell. In an embodiment, the conditional boundary for the first cell is created based at least in part on a relationship between the first cell and the second cell. In an embodiment, the first cell is placed relative to the second cell based at least in part on a conditional placement rule. In an embodiment, the first cell is placed relative to the second cell based at least in part on prBoundaries for respective cells. In this embodiment, cell placement is checked against the conditional placement rule for a fit according to conditional boundaries of the respective cells. When a fit is found, the first cell is abutted to the second cell according to the conditional boundaries, for example. In another embodiment, the conditional placement rule simulates a first scenario where a first cell is abutted against a second cell based at least in part on a first conditional boundary 122 and a second conditional boundary 124 and a second scenario where the first cell is abutted against the second cell based at least in part on a first prBoundary 112 and a second prBoundary 114. In an embodiment, the conditional placement rule checks a functionality of the first cell and a functionality of the second cell in the first scenario against the second scenario and enables conditional cell placement accordingly. For example, if the functionality is the same, the conditional placement rule places the first cell relative to the second cell based at least in part on the first conditional boundary 122 and the second conditional boundary 124. At 808, the method ends.

For at least some of the Figs., it will be appreciated that a first conditional boundary 122 and a second conditional boundary 124 are formed at edges 152 and 154, respectively. Additionally, the first conditional boundary 122 and the second conditional boundary 124 comprise a same width as a first prBoundary 112 and a second prBoundary 114, respectively. In other words, the conditional boundaries 122 and 124 are drawn with a different width than prBoundaries 112 and 114 merely for illustrative purposes, and are therefore not necessarily drawn to scale. That is, because dashed and dotted lines are used to represent different boundaries, if the dashed and dotted lines were drawn on top of one another they would not be distinguishable in the Figs. Accordingly, dimensions of some of these boundaries are drawn to be wider or narrower than needed so that the different boundaries are visible in the Figs., for example.

Figure 9:
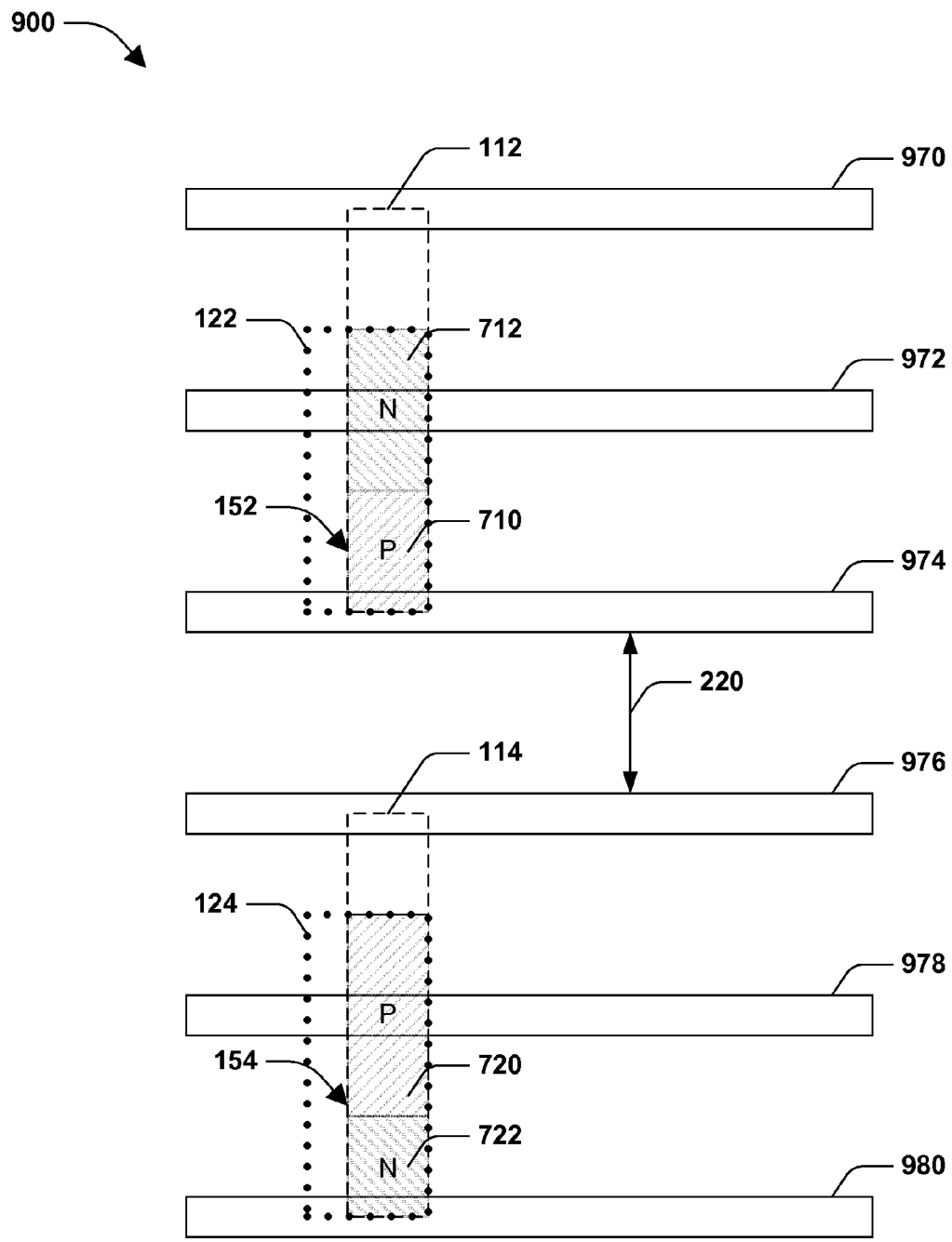
FIG. 9 is a top-down or layout view of an example conditional cell placement layout, according to an embodiment.
Figure 10:
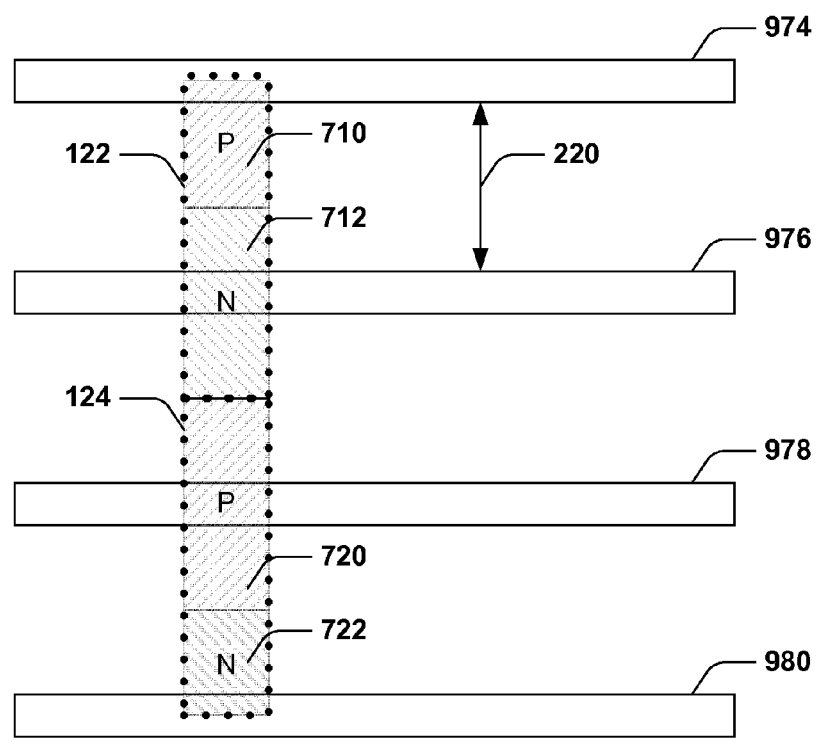
FIG. 10 is a top-down or layout view of an example conditional cell placement layout, according to an embodiment.

FIGS. 9 and 10 are top-down or layout views 900 and 1000 of an example conditional cell placement layout, according to an embodiment. FIG. 9 illustrates three Vdd lines 970, 974, and 978 and three Vss lines 972, 976, and 980. In an embodiment, Vdd 970, 974, and 978 are a first power domain, and Vss 972, 976, and 980 are a second power domain. In an embodiment of FIG. 9, a first cell is defined by a first prBoundary 112 and a second cell is defined by a second prBoundary 114. In an embodiment, the first cell comprises a first P portion 710 and a first N portion 712 and the second cell comprises a second P portion 720 and a second N portion 722. It will be appreciated that the first P portion 710 is connected to Vdd 974 or a first power domain and the first N portion 712 is connected to Vss 972 or a second power domain. Similarly, the second P portion 720 is connected to Vdd 978 or the first power domain and the second N portion 722 is connected to Vss 980 or the second power domain.

It will be appreciated that in some embodiments, the first cell is defined by a first conditional boundary 122 and the second cell is defined by a second conditional boundary 124. In an embodiment, a first cell is placed relative to a second cell by at least one of rotating an orientation of the first conditional boundary 122 or flipping the first conditional boundary 122 according to a line of symmetry. For example, in FIG. 9, the line of symmetry is Vdd 974. Accordingly, in an embodiment 1000 of FIG. 10, the first cell is flipped over Vdd 974 such that space 220 of FIG. 9 is removed and the first cell is abutted against the second cell. For example, in FIG. 10, the first P portion 710 is above the first N portion 712, while in FIG. 9, the first P portion 710 is below the second N portion 712. In another embodiment, the cell of FIG. 9 is rotated 180 degrees and placed in FIG. 10. In this way, a height of the semiconductor device is reduced from four unit tiles in FIG. 9 to three unit tiles in FIG. 10. For example, the height of the semiconductor device is four unit tiles in FIG. 9 at least because space 220 is unoccupied.

Figure 11:
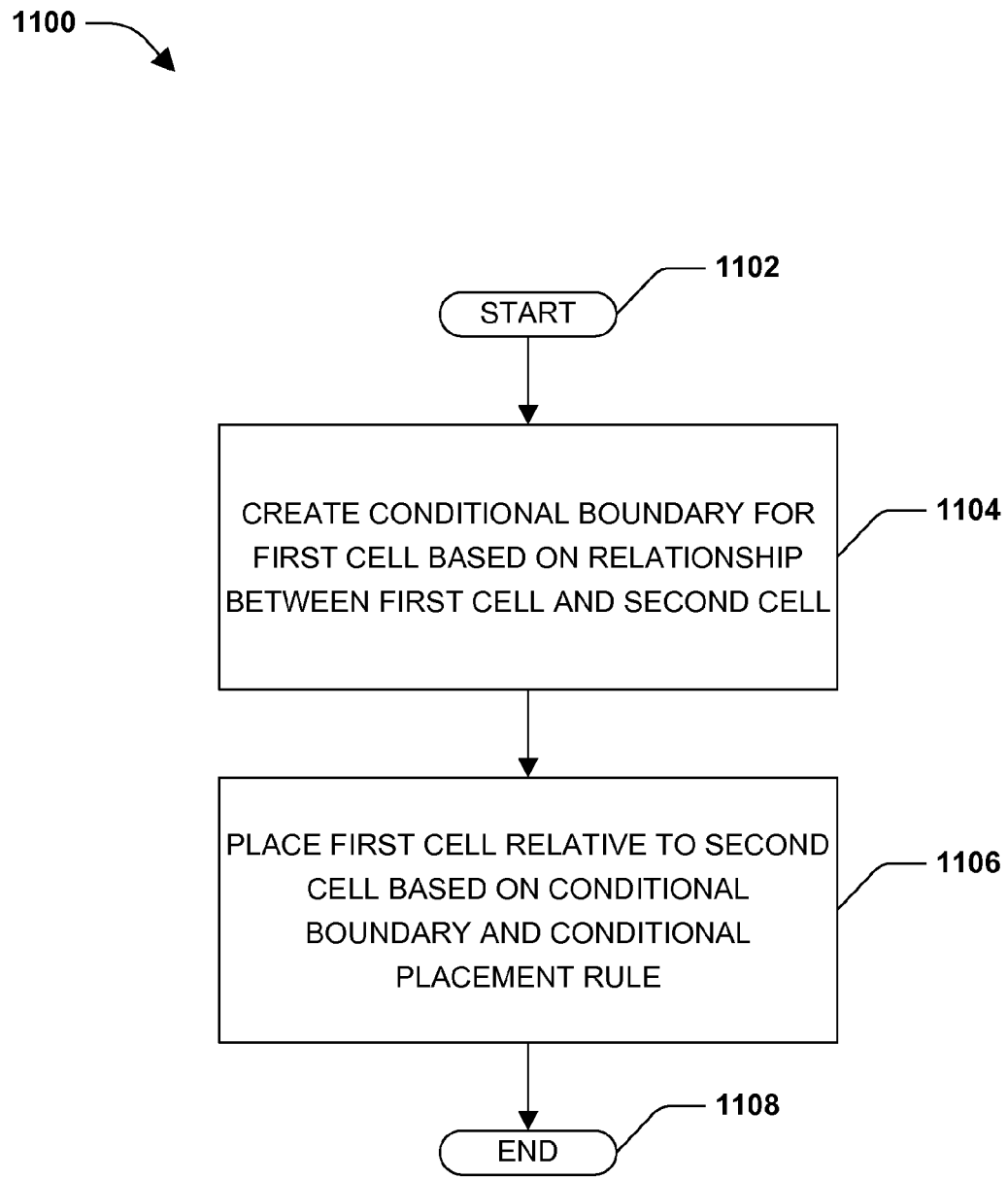
FIG. 11 is a flow diagram of an example method for conditional cell placement, according to an embodiment.

FIG. 11 is a flow diagram of an example method 1100 for conditional cell placement, according to an embodiment. At 1102, the method 1100 begins. At 1104, a conditional boundary 110 is created for a first cell based on a relationship between the first cell and a second cell. In an embodiment, a second conditional boundary is created for the second cell. At 1106, the first cell is placed relative to the second cell based on the conditional boundary 110 and a conditional placement rule. At 1108, the method 1100 ends.

Figure 12:
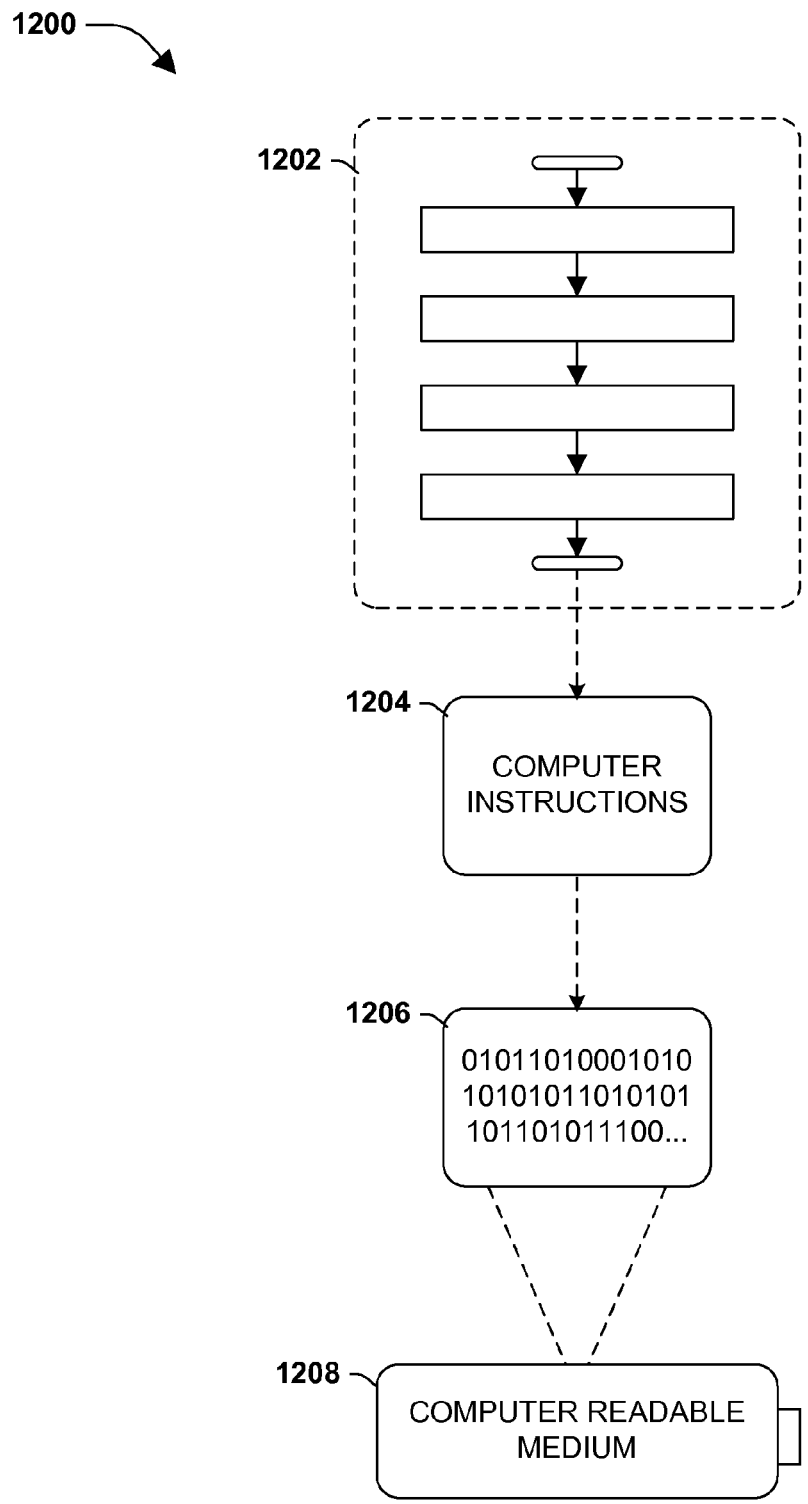
FIG. 12 is an illustration of an example computer-readable medium or computer-readable device comprising processor-executable instructions configured to embody one or more of the provisions set forth herein, according to an embodiment.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 12, wherein the implementation 1200 comprises a computer-readable medium 1208, such as a CD-R, DVD-R, flash drive, a platter of a hard disk drive, etc., on which is encoded computer-readable data 1206. This computer-readable data 1206 in turn comprises a set of computer instructions 1204 configured to operate according to one or more of the principles set forth herein. In an embodiment 1200, the processor-executable computer instructions 1204 are configured to perform a method 1202, such as at least some of the exemplary method 800 of FIG. 8 or at least some of exemplary method 1100 of FIG. 11, for example. In another embodiment, the processor-executable computer instructions 1204 are configured to implement a system, such as at least some of the exemplary system 500 of FIG. 5, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 13:
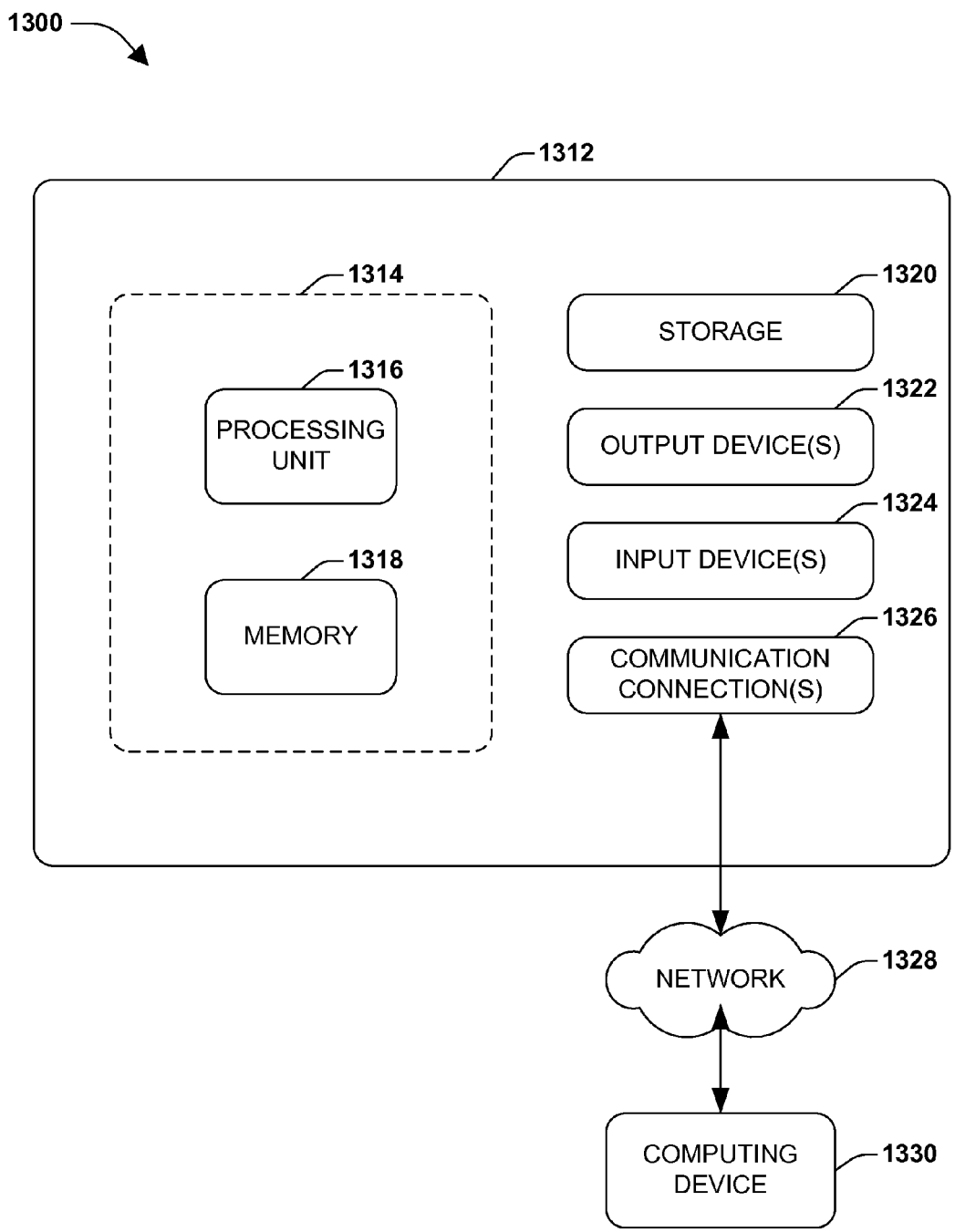
FIG. 13 is an illustration of an example computing environment where one or more of the provisions set forth herein are implemented, according to an embodiment.

FIG. 13 and the following discussion provide a brief, general description of a suitable computing environment to implement embodiments of one or more of the provisions set forth herein. The operating environment of FIG. 13 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 13 illustrates an example of a system 1300 comprising a computing device 1312 configured to implement one or more embodiments provided herein. In one configuration, computing device 1312 includes at least one processing unit 1316 and memory 1318. Depending on the exact configuration and type of computing device, memory 1318 may be volatile, such as RAM, non-volatile, such as ROM, flash memory, etc., or some combination of the two. This configuration is illustrated in FIG. 13 by dashed line 1314.

In other embodiments, device 1312 includes additional features or functionality. For example, device 1312 also includes additional storage such as removable storage or non-removable storage, including, but not limited to, magnetic storage, optical storage, and the like. Such additional storage is illustrated in FIG. 13 by storage 1320. In an embodiment, computer readable instructions to implement one or more embodiments provided herein are in storage 1320. Storage 1320 also stores other computer readable instructions to implement an operating system, an application program, and the like. Computer readable instructions are loaded in memory 1318 for execution by processing unit 1316, for example.

The term "computer readable media" as used herein includes computer storage media. Computer storage media includes volatile and nonvolatile, removable and non-removable media implemented in any method or technology for storage of information such as computer readable instructions or other data. Memory 1318 and storage 1320 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1312. Any such computer storage media is part of device 1312.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 1312 includes input device(s) 1324 such as keyboard, mouse, pen, voice input device, touch input device, infrared cameras, video input devices, or any other input device. Output device(s) 1322 such as one or more displays, speakers, printers, or any other output device are also included in device 1312. Input device(s) 1324 and output device(s) 1322 are connected to device 1312 via a wired connection, wireless connection, or any combination thereof. In an embodiment, an input device or an output device from another computing device are used as input device(s) 1324 or output device(s) 1322 for computing device 1312. Device 1312 also includes communication connection(s) 1326 to facilitate communications with one or more other devices.

According to an aspect, a method for conditional cell placement in a semiconductor layout is provided, comprising creating a conditional boundary for a first cell. The method comprises placing the first cell relative to a second cell based at least in part on the conditional boundary of the first cell.

According to an aspect, a computer-readable storage medium is provided, comprising computer-executable instructions, which when executed at least in part via a processing unit on a computer perform a method for conditional cell placement in a semiconductor layout, comprising creating a conditional boundary for a first cell based at least in part on a relationship between the first cell and a second cell. In an embodiment, the method comprises placing the first cell relative to the second cell based at least in part on the conditional boundary and a conditional placement rule.

According to an aspect, a system for conditional cell placement in a semiconductor layout is provided, comprising a boundary component and a placement engine. In an embodiment, the boundary component is configured to create a first conditional boundary and a first place-and-route boundary (prBoundary) for a first cell. In an embodiment, the boundary component is configured to create a second conditional boundary and a second prBoundary for a second cell. In an embodiment, the placement engine is configured to a placement engine configured to place the first cell relative to the second cell based at least in part on at least one of the first conditional boundary or the second conditional boundary and at least one of the first prBoundary or the second prBoundary.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for cell placement in a semiconductor layout, comprising:
    creating a conditional boundary of a first cell, the conditional boundary of the first cell different than a place-and-route boundary (prBoundary) of the first cell; and
    placing the first cell relative to a second cell based at least in part on the conditional boundary of the first cell such that the prBoundary of the first cell overlaps a prBoundary of the second cell, the placing comprising:
        abutting the first cell to the second cell such that no cells are between the conditional boundary of the first cell and a conditional boundary of the second cell, the abutting based at least in part on a unit tile width and a distance from the conditional boundary of the first cell to the conditional boundary of the second cell,
    at least some of at least one of the creating or the placing implemented at least in part via a processing unit.

2. The method of claim 1, the creating comprising creating the conditional boundary of the first cell based at least in part on a relationship between the first cell and the second cell.

3. The method of claim 1, the placing comprising placing the first cell relative to the second cell based at least in part on a conditional placement rule.

4. The method of claim 3, comprising creating the conditional placement rule based at least in part on a relationship between the first cell and the second cell.

5. The method of claim 1, wherein a width of the first cell is a multiple of the unit tile width.

6. The method of claim 1, the abutting comprising abutting the conditional boundary of the first cell with the conditional boundary of the second cell.

7. The method of claim 1, the abutting comprising abutting a first source portion of the first cell to a second source portion of the second cell such that:
    a first PMOS portion of the first source portion is abutted to a second PMOS portion of the second source portion;
    a first NMOS portion of the first source portion is abutted to a second NMOS portion of the second source portion;
    the first PMOS potion and the second PMOS portion are connected to a first power domain; and
    the first NMOS potion and the second NMOS portion are connected to a second power domain.

8. The method of claim 1, comprising creating a computer aided design (CAD) layer associated with the conditional boundary of the first cell.

9. The method of claim 1, comprising associating one or more coordinates with the conditional boundary of the first cell.

10. The method of claim 1, the creating comprising offsetting the conditional boundary of the first cell relative to the prBoundary of the first cell.

11. A non-transitory computer-readable storage medium comprising computer-executable instructions, which when executed perform a method for cell placement in a semiconductor layout, the method comprising:
    creating a conditional boundary of a first cell, the conditional boundary of the first cell different than a place-and-route (prBoundary) of the first cell; and
    placing the first cell relative to a second cell based at least in part on the conditional boundary of the first cell such that the prBoundary of the first cell overlap a prBoundary of the second cell, the placing comprising:
        abutting the first cell to the second cell such that no cells are between the conditional boundary of the first cell and a conditional boundary of the second cell, the abutting based at least in part on a unit tile width and a distance from the conditional boundary of the first cell to the conditional boundary of the second cell.

12. The non-transitory computer-readable storage medium of claim 11, the method comprising creating a conditional placement rule for specifying a placement of the first cell in relation to the second cell based at least in part on a functional relationship between the first cell and the second cell.

13. The non-transitory computer-readable storage medium of claim 11, the method comprising creating a computer aided design (CAD) layer associated with the conditional boundary of the first cell.

14. The non-transitory computer-readable storage medium of claim 11, the placing comprising placing the first cell relative to the second cell based at least in part on a design rule check.

15. The non-transitory computer-readable storage medium of claim 11, the placing comprising at least one of rotating an orientation of the first cell or flipping the first cell relative to a line of symmetry.

16. The non-transitory computer-readable storage medium of claim 11, the method comprising associating one or more coordinates with the conditional boundary of the first cell.

17. The non-transitory computer-readable storage medium of claim 11, the method comprising offsetting the conditional boundary of the first cell relative to the prBoundary of the first cell.

18. A system for cell placement in a semiconductor layout, comprising:
   a boundary component configured to create a conditional boundary for a first cell, the conditional boundary for the first cell different than a place-and-route boundary (prBoundary) for the first cell; and
   a placement engine configured to place the first cell-relative to a second cell based at least in part on the conditional boundary of the first cell such that the prBoundary of the first cell overlaps a prBoundary of the second cell, the placing comprising:
   abutting the first cell to the second cell such that no cells are between the conditional boundary of the first cell and a conditional boundary of the second cell, the abutting based at least in part on a unit tile width and a distance from the conditional boundary of the first cell to the conditional boundary of the second cell, at least some of at least one of the boundary component or the placement engine implemented at least in part via a processing unit.

19. The system of claim 18, the abutting comprising abutting a first source portion of the first cell to a second source portion of the second cell.

20. The system of claim 18, the placing comprising placing the first cell relative to the second cell based at least in part on a conditional placement rule.

* * * * *